(12) United States Patent
Ikisawa et al.

(10) Patent No.: US 8,148,245 B2
(45) Date of Patent: Apr. 3, 2012

(54) METHOD FOR PRODUCING A-IGZO OXIDE THIN FILM

(75) Inventors: Masakatsu Ikisawa, Kitaibaraki (JP); Masataka Yahagi, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/743,593

(22) PCT Filed: Dec. 24, 2008

(86) PCT No.: PCT/JP2008/073439
§ 371 (c)(1),
(2), (4) Date: Aug. 30, 2011

(87) PCT Pub. No.: WO2009/084537
PCT Pub. Date: Jul. 9, 2009

(65) Prior Publication Data
US 2011/0306165 A1 Dec. 15, 2011

(30) Foreign Application Priority Data

Dec. 27, 2007 (JP) ................................. 2007-336398

(51) Int. Cl.
*H01L 21/20* (2006.01)
*H01L 21/36* (2006.01)
(52) U.S. Cl. ........ 438/482; 438/483; 438/484; 438/485; 438/487; 428/480; 428/702; 204/298.13; 204/681
(58) Field of Classification Search .......... 438/482–487, 438/585, 779, 787, 796; 428/480, 702; 204/298.13, 204/192, 681
See application file for complete search history.

(56) References Cited

U.S. PATENT DOCUMENTS

| | | | |
|---|---|---|---|
| 7,923,356 B2 * | 4/2011 | Takayama et al. | ............ 438/482 |
| 2006/0148216 A1 * | 7/2006 | Takayama et al. | ............ 438/482 |
| 2007/0194379 A1 | 8/2007 | Hosono et al. | ................ 257/347 |

FOREIGN PATENT DOCUMENTS

| | | |
|---|---|---|
| JP | 2000-26119 | 1/2000 |
| JP | 2007-223849 | 9/2007 |
| WO | WO 2005/088726 | 9/2005 |

OTHER PUBLICATIONS

Hosono, "Ionic amorphous oxide semiconductors: Material design, carrier transport, and device application", *Journal of Non-Crystalline Solids*, vol. 352, Issues 9-20, Jun. 15, 2006, pp. 851-858.
Nomura, et al., "Room-temperature fabrication of transparent flexible thin-film transistors using amorphous oxide semiconductors", *Nature* 432, 488-492 (Nov. 25, 2004).
Nomura, et al., "Amorphous Oxide Semiconductors for High-Performance Flexible Thin-Film Transistors", *Japanese Journal of Applied Physics*, vol. 45, No. 5B, 2006, pp. 4303-4308.
Yabuta, et al., "High mobility thin-film transistor with amorphous InGaZnO$_4$ channel fabricated by room temperature rf-magnetron sputtering", *Applied Physics Lett.* 89, 112123 (2006).

* cited by examiner

*Primary Examiner* — Dung A. Le
(74) *Attorney, Agent, or Firm* — Drinker Biddle & Reath LLP

(57) ABSTRACT

There is provided a method for producing an a-IGZO oxide thin film by sputtering, which can control the carrier density of the film to a given value with high reproducibility. The method is an amorphous In—Ga—Zn—O based oxide thin film production method including: providing a sintered oxide material consisting essentially of indium (In), gallium (Ga), zinc (Zn), and oxygen (O) as constituent elements, wherein the ratio [In]/([In]+[Ga]) of the number of indium atoms to the total number of indium and gallium atoms is from 20% to 80%, the ratio [Zn]/([In]+[Ga]+[Zn]) of the number of zinc atoms to the total number of indium, gallium and zinc atoms is from 10% to 50%, and the sintered oxide material has a specific resistance of $1.0 \times 10^{-1}$ Ωcm or less; and producing a film on a substrate by direct current sputtering at a sputtering power density of 2.5 to 5.5 W/cm$^2$ using the sintered oxide material as a sputtering target.

10 Claims, 1 Drawing Sheet

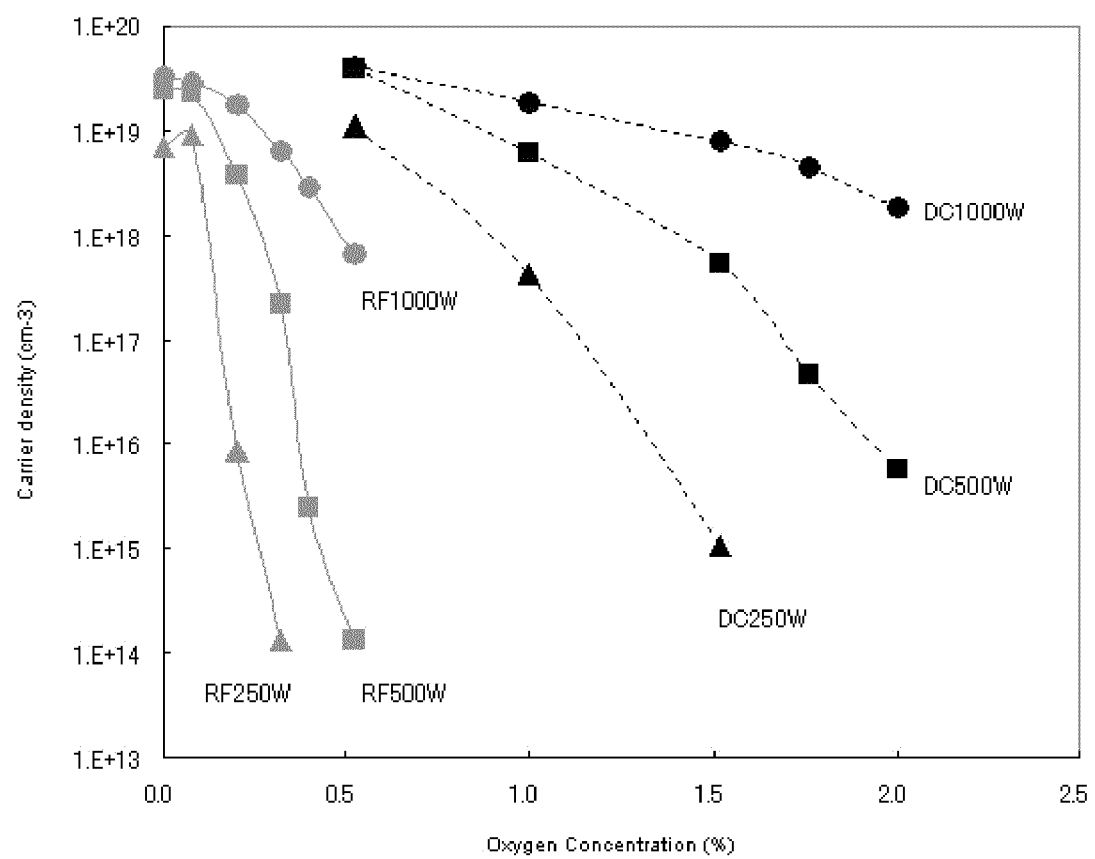

METHOD FOR PRODUCING A-IGZO OXIDE THIN FILM

FIELD OF THE INVENTION

The present invention relates to a method for producing an a-IGZO oxide thin film. More specifically, the invention relates to a method for producing an a-IGZO oxide thin film by a sputtering method using a sputtering target of a sintered oxide material consisting essentially of indium (In), gallium (Ga), zinc (Zn), and oxygen (O) as constituent elements. The invention also relates to methods for manufacturing a transistor and an active matrix driving display panel using the above production method.

DESCRIPTION OF THE RELATED ART

Many thin film transistors for applying a driving voltage to drive a display device are used in a display device for various displays such as liquid crystal displays, and their active layers have been produced with silicon-based materials, which have high stability, workability and the like.

However, silicon-based materials absorb light in the visible light range, so that upon light incidence, they may produce carries to cause thin film transistors to malfunction. In order to prevent this problem, a light-blocking layer such as a metal layer is provided. However, such means has disadvantages such as a reduction in aperture ratio or the need to increase the brightness of a backlight for the purpose of keeping the brightness of the screen, which may increase the power consumption.

Concerning the production of silicon-based materials, amorphous silicon films can be produced at lower temperature than polycrystalline silicon films. However, even the production of amorphous silicon films requires a high temperature of about 200° C. or more, which makes it unable to use a polymer film as a substrate, even though the polymer film has advantages such as low cost, light weight, and flexibility. In addition, the process of manufacturing devices at high temperature has production disadvantages such as high energy cost and time required for heating.

In recent years, therefore, thin film transistors have been developed using transparent oxide semiconductors in place of silicon-based materials. Transparent oxide semiconductors have been attracting attention, because as compared with conventional silicon-based materials, they exhibit higher performance such as the ability to form a film at low temperature without heating of a substrate, and the ability to show a high mobility of about 10 $cm^2/Vs$. Among them, amorphous In—Ga—Zn—O based materials (hereinafter also referred to as "a-IGZO"), which are composed of indium, gallium, zinc, and oxygen as constituent elements, are considered to be promising, since field effect transistors produced with them can have a high on/off ratio (see K. Nomura et al., "Room-temperature fabrication of transparent flexible thin-film transistors using amorphous oxide semiconductors," Nature, 432, pp. 488-492 (2004), and International Publication WO2005/088726 A1).

Films of a-IGZO can be produced using a target of a polycrystalline sintered material having the composition $InGaO_3(ZnO)_m$ by gas-phase method such as sputtering, pulsed laser deposition and electron beam deposition, and sputtering is considered to be most suitable in view of mass productivity (International Publication WO2005/088726 A1).

It is also reported that the electron carrier density of a-IGZO, which is an important factor in view of the electrical conductivity of films, can be controlled by the oxygen partial pressure during the production of films (K. Nomura et al., "Amorphous Oxide Semiconductor for High-Performance Flexible Thin-Film Transistors," Japanese Journal of Applied Physics vol. 45, No. 5B, pp. 4303-4308 (2006); H. Hosono, "Ionic amorphous oxide semiconductors: Material design, carrier transport, and device application," Journal of Non-Crystalline Solids 352 (2006) pp. 851-858; and H. Yabuta et al., "High-mobility thin-film transistor with amorphous $InGaZnO_4$ channel fabricated by room temperature rf-magnetron sputtering," Applied Physics Letters 89, 112123 (2006).

However, the techniques disclosed in the above documents have a problem in that a very small difference in oxygen partial pressure may cause a significant change in the carrier density of films, so that it will be unable to obtain a-IGZO films having the desired carrier density in a stable manner. In the conventional methods, the oxygen concentration must be controlled with very high accuracy in order to obtain a constant carrier density. In reality, however, it is impossible to control the oxygen concentration with the required accuracy, and therefore, the carrier density of films varies from one production to another, so that films with a constant carrier density cannot be produced with high reproducibility. Therefore, there is still room for improvement in view of industrial productivity.

SUMMARY OF THE INVENTION

The invention has been made in view of the above circumstances, and an object of the invention is to provide a method for producing a-IGZO oxide thin films, which makes it possible to keep the carrier density of films at a specific value with high reproducibility in a sputtering method suitable for large-area deposition, and to provide methods for manufacturing a transistor and an active matrix driving display panel based on such a production method.

As a result of investigations to solve the above problems, the inventors have found that when films are produced by direct current sputtering at a high sputtering power density, the oxygen concentration dependency of the film carrier density is reduced, so that the controllability of the carrier density of a-IGZO oxide thin films is improved.

According to an aspect, the invention is directed to a method for producing an amorphous In—Ga—Zn—O based oxide thin film, including: providing a sintered oxide material consisting essentially of indium (In), gallium (Ga), zinc (Zn), and oxygen (O) as constituent elements, wherein the ratio [In]/([In]+[Ga]) of the number of indium atoms to the total number of indium and gallium atoms is from 20% to 80%, the ratio [Zn]/([In]+[Ga]+[Zn]) of the number of zinc atoms to the total number of indium, gallium and zinc atoms is from 10% to 50%, and the sintered oxide material has a specific resistance of $1.0 \times 10^{-1}$ Ωcm or less; and producing a film on a substrate by direct current sputtering at a sputtering power density of 2.5 to 5.5 $W/cm^2$ using the sintered oxide material as a sputtering target.

In the oxide thin film production method according to an embodiment of the invention, the sintered oxide material may have a relative density of 95% or more.

In the oxide thin film production method according to an embodiment of the invention, the sputtering may be performed at a deposition rate of 2.5 Å/minute to 5.5 Å/minute.

The inventors have also found that when the film produced by direct current sputtering is annealed, the carrier density of the film tends to converge to a constant value depending on the concentration of oxygen in the atmospheric gas.

Accordingly, in another embodiment of the oxide thin film production method according to the invention, it further includes annealing the resulting film in an atmosphere containing oxygen at a specific concentration after the film is produced on the substrate by the direct current sputtering.

In a further embodiment of the oxide thin film production method according to the invention, the concentration of oxygen in the atmosphere may be 100% by volume during the annealing.

According to another aspect, the invention is directed to a method for manufacturing a thin film transistor, including the step of forming an active layer using the above oxide thin film production method.

According to still another aspect, the invention is directed to a method for manufacturing an active matrix driving display panel, including the step of forming an active device using said thin film transistor manufacturing method.

According to yet another aspect, the invention is directed to a sintered oxide material for use as a sputtering target in the above oxide thin film production method, which consists essentially of indium (In), gallium (Ga), zinc (Zn), and oxygen (O) as constituent elements, wherein the ratio [In]/([In]+[Ga]) of the number of indium atoms to the total number of indium and gallium atoms is from 20% to 80%, and the ratio [Zn]/([In]+[Ga]+[Zn]) of the number of zinc atoms to the total number of indium, gallium and zinc atoms is from 10% to 50%, and has a specific resistance of $1.0 \times 10^{-1}$ Ωcm or less.

In an embodiment of the invention, the sintered oxide material may have a relative density of 95% or more.

Effect of the Invention

As described above, an embodiment of the invention makes it possible to keep the carrier density of a-IGZO films at a specific value with high reproducibility in a sputtering method suitable for large-area deposition. Thus, thin film transistors and active matrix driving display panels can be provided with high quality stability.

BRIEF DESCRIPTION OF THE DRAWING

FIG. 1 is a graph showing a correlation among the oxygen concentration, the sputtering power and the film carrier density when sputtering is performed using the sintered oxide material according to the invention.

DETAILED DESCRIPTION OF THE INVENTION

While preferred embodiments of the invention are described below with respect to a sintered oxide material, a method for producing an oxide thin film, a method for evaluating a film, and a method for annealing an oxide thin film, it will be understood that the invention is not limited to the embodiments described below.

Sintered Oxide Material

The sintered oxide material for use in an embodiment of the invention consists essentially of indium (In), gallium (Ga), zinc (Zn), and oxygen (O) as constituent elements, wherein the ratio [In]/([In]+[Ga]) of the number of indium atoms to the total number of indium and gallium atoms is from 20% to 80%, and the ratio [Zn]/([In]+[Ga]+[Zn]) of the number of zinc atoms to the total number of indium, gallium and zinc atoms is from 10% to 50%, and the sintered oxide material has a specific resistance of $1.0 \times 10^{-1}$ Ωcm or less. In this context, [In], [Ga] and [Zn] represent the number of indium atoms, the number of gallium atoms and the number of zinc atoms, respectively.

The sintered oxide material consists essentially of In, Ga, Zn, and O as constituent elements. The term "essentially" means that the sintered oxide material of the invention may include an element or elements other than In, Ga, Zn, and O, such as an element(s) inevitably introduced during the process of purification of generally available materials or an inevitable impurity element(s) coming from the process of producing the sintered oxide material, at an inevitably occurring concentration such as up to about 10 ppm, as a constituent element or elements.

The sintered oxide material according to the invention also satisfies the composition requirements that the ratio [In]/([In]+[Ga]) of the number of indium atoms to the total number of indium and gallium atoms is from 20% to 80% and that the ratio [Zn]/([In]+[Ga]+[Zn]) of the number of zinc atoms to the total number of indium, gallium and zinc atoms is from 10% to 50%. The composition requirements are defined so that the film obtained by sputtering from a target made of the sintered oxide material having the composition can have a resistivity in the range where the film is suitable for use as a transparent semiconductor.

An increase in the In ratio tends to result in an increase in the carrier density of the film obtained by sputtering from a target made of the sintered oxide material. On the other hand, an increase in the Ga ratio tends to result in a decrease in the carrier density of the film. Specifically, if [In]/([In]+[Ga]) is more than 80%, the carrier density of the film will be too high, so that the on/off ratio (an important index of the device characteristics) of a thin film transistor produced with the film as an active layer may be degraded. If [In]/([In]+[Ga]) is less than 20%, the carrier density of the film will be too low in contrast to the above, so that the film may have low mobility, which is not preferred for the device characteristics.

If [Zn]/([In]+[Ga]+[Zn]) is more than 50%, the stability, the humidity resistance and the like of the film may be degraded. If [Zn]/([In]+[Ga]+[Zn]) is less than 10%, the film formed by sputtering may be less amorphous and more likely to be crystalline. The crystallized film may have significant in-plane fluctuations in characteristics to cause fluctuations in device characteristics. In addition, the decrease in the Zn concentration means an increase in the In or Ga concentration, which means an increase in the cost of the sintered oxide material itself, because these metals are relatively expensive.

In general, In is present in a trivalent form, Ga in a trivalent form, and Zn in a divalent form. In an embodiment, if oxygen deficiency is not taken into account, the sintered oxide material may be represented by the following formula: $In_xGa_yZn_zO_a$, wherein $0.2 \leq x/(x+y) \leq 0.8$, $0.1 \leq z/(x+y+z) \leq 0.5$, and $a=(3/2)x+(3/2)y+z$. For example, when In:Ga:Zn=1:1:1, the sintered oxide material may be represented by $InGaZnO_4$, and when In:Ga:Zn=2:2:1, it may be represented by $InGaZnO_7$.

The sintered oxide material preferably has a relative density of 95% or more. If the relative density of the sintered oxide material is less than 95%, the carrier density of the film may significantly vary, and the generation of nodules and the frequency of abnormal discharge may increase with the passage of sputtering time in the process of forming a film by sputtering using the sintered oxide material as a target, so that the resulting film may have degraded characteristics. The relative density is preferably 97% or more, typically from 95 to 99%.

A method for determining the relative density of the sintered oxide material may include determining the density of the sintered oxide material, which is assumed to have a relative density of 100%, from the respective constituent elements and the form for each composition, actually preparing the sintered oxide material and determining the density thereof by Archimedes' method or the like, and dividing the measurement by the density for 100% relative density to calculate the relative density.

International Publication WO2005/088726 A1, in which the production of a sintered In—Ga—Zn—O based oxide material is described, only discloses a relative density of 90% or more in the section of examples, and is completely silent on the production of a sintered oxide material with a relative density of 95% or more as disclosed herein. In International Publication WO2005/088726 A1, the need to increase the density of the sintered oxide material is not recognized at all, and it does not disclose or suggest any solution. The sintered oxide material prepared in International Publication WO2005/088726 A1 has a density of 90% or more, which is not so high. This may be because the pulverizing time, the uniaxial compression pressure, or the like is not sufficient among the conditions of the production of the sintered oxide material.

In addition, an a-IGZO film can be formed on a substrate by a sputtering method using the sintered oxide material as a sputtering target.

The sputtering method generally includes applying a voltage between the substrate as an anode and the sputtering target as a cathode in an argon gas atmosphere, so that argon cations in an argon plasma produced by glow discharge collide with the cathode sputtering target, from which particles are sputtered and deposited on the substrate to form a thin film. Sputtering methods may be classified into two types according to how to produce the argon plasma, and those using a radio-frequency plasma are called radio-frequency sputtering methods (RF sputtering methods), while those using a direct current plasma are called direct current sputtering methods (DC sputtering methods).

In an embodiment of the invention, a DC sputtering method is used. This is because the controllability of the carrier density of the film is significantly improved, when DC sputtering is used. In the case of radio-frequency (RF) sputtering, a slight change in the oxygen concentration of the atmosphere during the film production may cause a significant change in the carrier density. In direct current sputtering, however, as the oxygen concentration changes, the carrier density slowly changes, and therefore, strict control of the oxygen concentration is unnecessary.

In addition, direct current sputtering methods have advantages such as the ability to perform high-speed film production, inexpensive power supply systems, and easy operation including easy production of plasma, over radio-frequency sputtering methods. The direct current sputtering method as disclosed herein may also include a direct current pulsing method, which includes periodically stopping the voltage applied to a sputtering target and applying a low positive voltage for electrical neutralization.

The sintered oxide material of the invention is defined to have a specific resistance of $1.0 \times 10^{-1}$ Ωcm or less and therefore suitable for use as a sputtering target in a direct current sputtering method. When the specific resistance of the sintered oxide material is not more than this value, the film production can be stably performed by direct current sputtering method. The specific resistance is more preferably $1.0 \times 10^{-2}$ Ωcm or less, so that the film production can be stably performed by direct current sputtering method under a considerably wide range of sputtering conditions. In an embodiment of the invention, the sintered oxide material typically has a specific resistance of $1.2 \times 10^{-4}$ to $4.0 \times 10^{-4}$ Ωcm. The specific resistance of the sintered oxide material may be measured by four-terminal method or the like.

The sintered oxide material according to the invention may be produced as described below.

Indium oxide ($In_2O_3$), gallium oxide ($Ga_2O_3$) and zinc oxide (ZnO) may be used as raw materials. In order to avoid the adverse effect of impurities on the electrical properties, raw materials with a purity of 4N or higher are preferably used. Raw material powders are each weighed so that the desired composition ratio can be achieved.

Mixing is then performed. If mixing is insufficient, each component may segregate in the produced target, so that a high resistivity region and a low resistivity region may occur, which may cause abnormal discharge such as arcing caused by electrification or the like in the high resistivity region during sputtering. Thus, sufficient mixing is necessary. Therefore, for example, raw materials are mixed in a super mixer at a speed of rotation of 2,000 to 4,000 rpm for a time period of 3 to 5 minutes in the air. Since the raw material powders are oxides, it is not necessary to prevent the oxidation of the raw materials, and therefore, the atmospheric gas may be air, with no need to use expensive gas such as argon. Alternatively, the mixing method may be a method of mixing in a ball mill for a long time or any other method capable of achieving the aim of uniformly mixing the raw materials.

The mixed powder is then calcined in an electric furnace in the air atmosphere at a temperature in the range of 900 to 1,100° C. for a time period of about 4 to 6 hours.

Pulverization is then performed. Like the mixing of the raw materials, an object of the pulverization is to uniformly disperse the raw material powders into the target. The presence of large particle-size material powder means local unevenness in composition, which may cause abnormal discharge during sputtering. In a preferred mode, the calcined powder is placed together with zirconia beads in an attritor and pulverized at a speed of rotation of 200 to 400 rpm for a time period of 2 to 4 hours. The pulverization is preferably performed until the average particle size (D50) of the raw material powder reaches 1 μm or less, preferably 0.6 μm or less.

Granulation is then performed. An object of the granulation is to improve the fluidity of the raw material powder so that the packed state can be good enough during press molding. The water content is controlled so that the pulverized raw materials can form a slurry with a solid content of 40 to 60%, when the granulation is performed. In this process, the inlet temperature is set at 180 to 220° C., while the outlet temperature is set at 110 to 130° C.

Press molding is then performed. The granulated powder is subjected to press molding under the conditions of a surface pressure of 400 to 800 kgf/cm² and a holding time of 1 to 3 minutes. If the surface pressure is less than 400 kgf/cm², it will be unable to obtain a molded product with a sufficiently high density. A surface pressure of more than 800 kgf/cm² is not necessary, and such a pressure is cost- or energy-consuming and not preferred for the production.

The product is then formed in hydrostatic pressure equipment (CIP) under the conditions of a surface pressure of 1,700 to 1,900 kgf/cm² and a holding time of 1 to 3 minutes.

In an electric furnace in an oxygen atmosphere, the product is then heated at a rate of 0.5 to 2.0° C./minute to 700 to 900° C., held for 4 to 6 hours, then heated at a rate of 0.5 to 5.0° C./minute to 1,300 to 1,500° C., then held for 10 to 30 hours, and then allowed to cool in the furnace or cooled at a rate of 2.0 to 5.0° C./minute. If the sintering temperature is lower than 1,300° C., the density of the sintered material cannot be high enough. On the other hand, if it is higher than 1,500° C., the life of the furnace heater may be reduced. If the holding time is shorter than 10 hours, the reaction between the raw material powders cannot sufficiently proceed, and the sintered material is not likely to have a sufficiently high density or can warp. If the sintering time is more than 30 hours, energy and time may be unnecessarily consumed, which is not preferred for the production. If the heating rate is less than 0.5° C./minute, time may be unnecessarily consumed until the desired temperature is reached. If the heating rate is more than 5.0° C./minute, the temperature distribution in the furnace may be unevenly raised, so that unevenness or cracking of the sintered material may occur. The sintered material obtained as described above has a relative density of about 95% or more and a specific resistance of $5.0 \times 10^{-3}$ Ωcm or less, which depends on the composition.

Methods for producing the sputtering target are described below.

The sintered oxide material obtained by the production method described above may be subjected to cylindrical grinding of the rim and flat surface grinding of the face, so that it may be processed into a size suitable for the sputtering equipment to be used, such as a thickness of about 4 to 6 mm and a diameter of 6 inches. The processed material may be bonded to a backing copper plate with an indium-based alloy or the like as a bonding metal, so that the sputtering target can be obtained.

Method for Producing Oxide Thin Film

Direct current sputtering is described below.

The sputtering target produced by the method described above and a glass substrate or the like are placed in a sputtering system, and the sputtering chamber is evacuated to a degree of vacuum of about $5 \times 10^{-4}$ Pa or less by means of a rotary pump and a cryopump. If the degree of vacuum is insufficient, oxygen or water may remain in the chamber and be introduced into a film during sputtering to have an adverse effect on the electrical characteristics of the film.

A gas mixture of argon and oxygen may be used as the sputtering gas. For example, a method for controlling the concentration of oxygen in the gas mixture may include providing a 100% argon gas cylinder and a gas cylinder containing argon and 2% oxygen therein and appropriately setting the flow rate of the gas supplied from each gas cylinder to the chamber by controlling the mass flow. In this context, the concentration of oxygen in the gas mixture means the ratio: oxygen partial pressure/(oxygen partial pressure+argon partial pressure), which is also equal to the quotient obtained by dividing the oxygen flow rate by the total flow rate of oxygen and argon. While the oxygen concentration may be changed as needed according to the desired carrier density, it may be typically from 1 to 3%, more typically from 1 to 2%.

The total pressure of the sputtering gas may be from about 0.3 to 0.8 Pa. If the total pressure is lower than this range, it may be difficult to establish plasma discharge, or established plasma discharge may be unstable. If the total pressure is higher than this range, the deposition rate may become lower, so that a problem such as an adverse effect on the productivity may occur.

Plasma generation methods include both a radio-frequency (RF) sputtering method and a direct current (DC) sputtering method. For the purpose of simply producing a film, both methods may be used. The radio-frequency (RF) sputtering method can be performed regardless of the specific resistance of the target, for example, even with a dielectric target. However, the direct current (DC) sputtering method requires the target to have a specific resistance of a certain value or less, such as $1 \times 10^{-1}$ Ωcm or less.

In an embodiment of the invention, the sintered oxide material has such a low level of specific resistance that direct current (DC) sputtering is possible, and therefore makes it possible to use direct current (DC) sputtering method. In an embodiment of the invention, direct current (DC) sputtering method is used for sputtering deposition in order to obtain films with a constant carrier density with high reproducibility.

The distance between the target and the substrate should be set at 70 to 120 mm. If the distance is too short, particles of the constituent elements of the target may have too high kinetic energy when arriving at the substrate, so that the substrate may be severely damaged, which makes it unable to obtain good film properties, degrading the in-plane distribution of the electrical characteristics of the film or the thickness of the film. If the distance is too long, particles of the constituent elements of the target may have too low kinetic energy when arriving at the substrate, so that it may be unable to form a dense film or obtain good film properties.

In an embodiment of the invention, the film can be produced by sputtering without heating the substrate. During the deposition, the temperature of the substrate may be from about 25 to 50° C. (sputtering-induced temperature rises or so). This is advantageous in that energy or time for heating the substrate is not necessary, and the most advantageous point is that materials other than glass can also be used for the substrate. For example, a resin material that cannot withstand high temperature may be used as the substrate. The substrate is preferably transparent. Examples of such a material include polyethylene terephthalate (PET), polyethersulfone (PES), polyethylene naphthalate (PEN), polycarbonate (PC), and polyarylate (PAR). A film may be deposited thereon to improve the adhesion or prevent degassing.

For example, when the target size is 6 inches, the sputtering power is preferably from 500 to 1,200 W, which may be converted to a sputtering power density of about 2.7 W/cm² to 6.6 W/cm², preferably 3.2 to 4.5 W/cm². The sputtering power density is the quotient obtained by dividing the sputtering power by the area of the sputtering target. Even at the same power, the power actually received by the sputtering target and the deposition rate vary with the size of the target. Therefore, the sputtering power density may be used as an index for indicating the power applied to the sputtering target in a standardized manner. If the sputtering power density is less than 2.7 W/cm², the carrier density of the film deposited by sputtering may be significantly dependent on the oxygen concentration. This means that even a slight change in the oxygen concentration may cause a significant change in the carrier density, so that it may be difficult to obtain films with a constant carrier density with high reproducibility. If the sputtering power density is more than 6.6 W/cm², the deposition rate may become so high that the film thickness controllability may be degraded. Therefore, even if the deposition time is controlled to be constant by opening and closing a shutter in the same manner, the film thickness may significantly change by a slight difference in time period when the shutter is opened and closed.

The above appropriate range of the sputtering power may correspond to a deposition rate of about 2.5 Å/second to 5.5 Å/second under normal sputtering conditions. Alternatively, therefore, the deposition rate may be used for the control. The deposition rate of sputtering is the quotient obtained by dividing the film thickness by the deposition time period, which is proportional to the sputtering power density under the normal range of deposition conditions. The deposition rate should be in the above range for the same reason as that for the sputtering power range defined above, namely, in order that the controllability of the carrier density and the controllability of the film thickness may be established at the same time. The deposition rate is preferably from about 3.0 Å/second to 4.5 Å/second.

The film formed without heating the substrate is generally an a-IGZO film. The a-IGZO film has a flat surface and high in-plane uniformity and does not have grain boundaries as in a polycrystalline film. Therefore, the a-IGZO film is advantageous in that when the film is used as an active layer to form a device, variations in the device characteristics can be reduced to a very low level.

Method for Evaluation of Film

The method for evaluating characteristics of a film is described hereinafter.

The thickness of the film obtained by sputtering may be measured with a step profiler. The carrier density of the film may be determined by Hall measurement according to the Van der Pauw method. Specifically, the film-carrying glass substrate or the like is cut into an about 10 mm square piece. Electrodes of indium or the like are attached to the four corners of the piece, and the piece is placed in the Hall measurement system so that the resistivity, carrier density and mobility of the film can be measured. Whether the film is amorphous or not may be determined by X-ray diffraction system. The composition of the film may be measured by fluorescent X-ray analysis.

Method for Annealing Oxide Thin Film

The method for annealing the oxide thin film is described below.

The glass substrate carrying the film obtained by sputtering is placed in a furnace whose temperature can be set at a predetermined value. First, the air is evacuated from the furnace by means of a rotary pump or the like, and then pure oxygen or a specific type of gas with a predetermined concentration is introduced into the furnace. After the furnace is heated to a predetermined temperature (generally 100 to 600° C., preferably 200 to 400° C. in terms of sufficiently producing the effect of annealing and preventing the crystallization of the film), the temperature is held for a certain period of time (generally 1 to 60 minutes, preferably 1 to 20 minutes because the effect of annealing may be saturated, if it is performed for too long a period of time), after which the temperature is lowered, thereby annealing the oxide thin film. An important thing in this process is to evacuate the air from the furnace in which the oxide thin film is placed. If the evacuation is insufficient, annealing cannot be performed in a specific type of gas with a predetermined concentration and may be affected by residual oxygen or nitrogen in the atmosphere.

In an embodiment of the invention, the carrier density of the a-IGZO film is controlled by the oxygen deficiency in the film. Therefore, when annealing is performed in an oxygen-containing gas atmosphere, the oxygen deficiency can be eliminated from the film, so that the carrier density of the film can be reduced or controlled. On the other hand, when annealing is performed in an oxygen-free gas atmosphere such as nitrogen, the oxygen deficiency in the film may further develop and increase the carrier density. The carrier density tends to converge to a constant value, depending on the concentration of oxygen in the atmosphere gas, and therefore, variations in the carrier density of the film per lot can be further reduced. The carrier density is more likely to converge to a constant value when the oxygen concentration is high than when it is low. This may be because the oxygen deficiency, which causes the carrier, can be more effectively eliminated when the oxygen concentration is high. Therefore, the concentration of oxygen in the atmosphere during annealing is typically 25% by volume or more, more typically 50% by volume or more, further typically 100% by volume, so that variations in the carrier density can be more effectively reduced.

The oxide thin film obtained using the production method according to an embodiment of the invention may be used as an active layer for a thin film transistor. The thin film transistor obtained using the above production method may be used as an active device to form an active matrix driving display panel.

EXAMPLES

The invention is more specifically described by the examples below.

The physical properties of sintered materials and films were measured by the methods described below.

Relative Density of Sintered Material

The actual density was measured by Archimedes' method, and the relative density was calculated by dividing the actual density by the theoretical density determined from the constituent elements.

Specific Resistance of Sintered Material

The sintered material was cut into a piece, and the specific resistance of the cut piece was determined by Hall measurement using Model RESITEST 8200 manufactured by TOYO Corporation.

Crystal Structure of Sintered Material

The crystal structure of the sintered material was analyzed using an X-ray diffraction system (Model RINT-1100 manufactured by Rigaku Corporation).

Composition of Sintered Material

The composition of the sintered material was determined by ICP (inductively coupled plasma) analysis using Model SPS3000 manufactured by SII Nano Technology Inc.

Film Thickness

The film thickness was determined using a step profiler (Model Dektak 8 STYLUS PROFILER, manufactured by Veeco Instruments).

Resistivity, Carrier Density and Mobility of Film

The film-carrying glass substrate was cut into an about 10 mm square piece, and indium electrodes were attached to four corners of the cut piece. The cut piece was placed in a Hall measurement system (Model Resitest 8200 manufactured by TOYO Corporation), and the measurement was performed.

Crystalline or Amorphous Structure of Film

The crystallinity was determined using an X-ray diffraction system RINT-1100 manufactured by Rigaku Corporation.

Composition of Film

The composition of the film was determined by ICP (inductively coupled plasma) analysis using Model SPS3000 manufactured by SII Nano Technology Inc.

Example 1-1

Indium oxide ($In_2O_3$), gallium oxide ($Ga_2O_3$) and zinc oxide (ZnO) powders as raw materials were each weighed so that the metal element composition ratio In:Ga:Zn could be 1:1:1. The weighed raw material powders were mixed in a super mixer at a speed of rotation of 3,000 rpm for a time period of 4 minutes in the air. The mixed powder was held in an electric furnace at 1,000° C. for 5 hours in the atmosphere. The calcined powder was placed together with zirconia beads in an attritor and pulverized at a speed of rotation of 300 rpm for a time period of 3 hours. In the pulverization, the average particle size (D50) of the raw material powder reached 0.59 μm. The water content was controlled so that the pulverized raw material powder could form a slurry with a solid content of 50%, and granulation was performed with the inlet temperature set at 200° C. and the outlet temperature set at 120°

C. The granulated powder was subjected to press molding under the conditions of a surface pressure of 400 kgf/cm² and a holding time of 1 minute and then formed in hydrostatic pressure equipment (CIP) under the conditions of a surface pressure of 1,800 kgf/cm² and a holding time of 1 minute. Subsequently, the product was heated at a rate of 1.0° C./minute to 800° C., then held for 5 hours, then heated at a rate of 1.0° C./minute to 1,450° C., then held for 20 hours, and then allowed to cool in the electric furnace in the oxygen atmosphere. The resulting sintered material had a relative density of about 98% and a specific resistance of $3.2 \times 10^{-3}$ Ωcm. As a result of the X-ray diffraction analysis, the sintered material was found to be a crystalline oxide having a composition represented by the formula: $InGaZnO_4$.

Comparative Example 1-1

A sintered oxide material was prepared under almost the same conditions as in Example 1-1 except for the following modification of the conditions. The time of pulverization of the calcined powder in the attritor was changed to 1 hour, the granulated powder was pressed under a surface pressure of 100 kgf/cm², and press forming in the hydrostatic pressure equipment (CIP) was not performed. The resulting sintered material had a relative density of about 80% and a specific resistance of 4.0 Ωcm. As a result of the X-ray diffraction analysis, the sintered material was found to be a crystalline oxide having a composition represented by the formula: $InGaZnO_4$.

Comparative Example 1-2

A sintered oxide material was prepared under almost the same conditions as in Example 1-1 except for the following modification of the conditions. The granulated powder was pressed under a surface pressure of 200 kgf/cm², and press forming in the hydrostatic pressure equipment (CIP) was not performed. The resulting sintered material had a relative density of about 85% and a specific resistance of 3.9 Ωcm. As a result of the X-ray diffraction analysis, the sintered material was found to be a crystalline oxide having a composition represented by the formula: $InGaZnO_4$.

Comparative Example 1-3

A sintered oxide material was prepared under almost the same conditions as in Example 1-1 except for the following modification of the conditions. The surface pressure in the hydrostatic pressure equipment (CIP) was changed to 900 kgf/cm². The resulting sintered material had a relative density of about 92% and a specific resistance of 3.8 Ωcm. As a result of the X-ray diffraction analysis, the sintered material was found to be a crystalline oxide having a composition represented by the formula: $InGaZnO_4$.

Summary of Example 1-1 and Comparative Examples 1-1 to 1-3

As described above, the sintered oxide material prepared under the oxide sintering conditions in Example 1-1 had the intended density and specific resistance. However, the sintered oxide materials prepared under the oxide sintering conditions in the comparative examples did not have a sufficient sintered density.

Example 2-1

The sintered material prepared by the method described in Example 1-1 was worked into a disc with a diameter of 6 inches and a thickness of 5 mm, which was used as a sputtering target. The sputtering target and a Corning #1737 glass substrate with a diameter of 4 inches and a thickness of 0.7 mm were placed in a sputtering system, and the sputtering chamber was evacuated to a degree of vacuum of about $5 \times 10^{-4}$ Pa or less by means of a rotary pump and a cryopump. Subsequently, the flow rate of each of pure argon gas and argon gas containing 2% oxygen was controlled by a mass flow controller, so that sputtering gas with an oxygen concentration of 2.0% was introduced into the chamber. The total pressure of the sputtering gas in the chamber was set at 0.5 Pa. A direct current (DC) sputtering method was used with a sputtering power of 1,000 W and a target-substrate distance of 80 mm. The substrate was not heated. The deposition was performed at a rate of 5.29 Å/second for a time period of 197 seconds to form a film with a thickness of 1,043 Å. As a result of Hall measurement, the film had a carrier density of $1.79 \times 10^{18}$ cm$^{-3}$, a mobility of 9.35 cm²/Vs, and a resistivity of $3.74 \times 10^{-1}$ Ωcm. The film had a composition of $InGaZnO_4$ and was amorphous. The conditions and the results are shown in Table 1.

TABLE 1

| | Power source type | Power (W) | Power density (W/cm²) | Oxygen concentration (%) | Carrier density (cm$^{-3}$) | Mobility (cm²/Vs) | Resistivity (Ω cm) | Film thickness (Å) | Time (seconds) | Deposition rate (Å/sec) |
|---|---|---|---|---|---|---|---|---|---|---|
| Example 2-1 | DC | 1000 | 5.48 | 2.00 | $1.79 \times 10^{18}$ | 9.35 | $3.74 \times 10^{-1}$ | 1043 | 197 | 5.29 |
| Example 2-2 | DC | 1000 | 5.48 | 1.76 | $4.32 \times 10^{18}$ | 10.10 | $1.43 \times 10^{-1}$ | 1010 | 189 | 5.34 |
| Example 2-3 | DC | 1000 | 5.48 | 1.52 | $8.02 \times 10^{18}$ | 12.50 | $6.26 \times 10^{-2}$ | 1007 | 187 | 5.39 |
| Example 2-4 | DC | 1000 | 5.48 | 1.00 | $1.75 \times 10^{19}$ | 12.00 | $2.96 \times 10^{-2}$ | 997 | 187 | 5.33 |
| Example 2-5 | DC | 1000 | 5.48 | 0.52 | $4.04 \times 10^{19}$ | 11.10 | $1.39 \times 10^{-2}$ | 1020 | 188 | 5.43 |
| Example 2-6 | DC | 500 | 2.74 | 2.00 | $5.60 \times 10^{15}$ | 4.98 | $2.24 \times 10^{2}$ | 1017 | 394 | 2.58 |
| Example 2-7 | DC | 500 | 2.74 | 1.76 | $4.51 \times 10^{16}$ | 7.59 | $1.83 \times 10^{1}$ | 993 | 378 | 2.63 |
| Example 2-8 | DC | 500 | 2.74 | 1.52 | $5.17 \times 10^{17}$ | 9.73 | $1.24 \times 10^{0}$ | 997 | 373 | 2.67 |
| Example 2-9 | DC | 500 | 2.74 | 1.00 | $5.99 \times 10^{18}$ | 11.10 | $9.36 \times 10^{-2}$ | 1010 | 379 | 2.66 |
| Example 2-10 | DC | 500 | 2.74 | 0.52 | $3.89 \times 10^{19}$ | 10.40 | $1.54 \times 10^{-2}$ | 1013 | 376 | 2.69 |
| Comparative Example 2-1 | DC | 250 | 1.37 | 1.52 | $1.06 \times 10^{15}$ | 5.90 | $1.00 \times 10^{3}$ | 965 | 742 | 1.30 |
| Comparative Example 2-2 | DC | 250 | 1.37 | 1.00 | $4.13 \times 10^{17}$ | 9.10 | $1.66 \times 10^{0}$ | 944 | 706 | 1.34 |
| Comparative Example 2-3 | DC | 250 | 1.37 | 0.52 | $1.10 \times 10^{19}$ | 11.10 | $5.09 \times 10^{-2}$ | 952 | 702 | 1.36 |
| Comparative Example 2-4 | RF | 1000 | 5.48 | 0.50 | $6.67 \times 10^{17}$ | 11.80 | $7.92 \times 10^{-1}$ | 1006 | 365 | 2.76 |
| Comparative Example 2-5 | RF | 1000 | 5.48 | 0.40 | $2.82 \times 10^{18}$ | 9.87 | $2.25 \times 10^{-1}$ | 1006 | 356 | 2.83 |

TABLE 1-continued

| | Power source type | Power (W) | Power density (W/cm$^2$) | Oxygen concentration (%) | Carrier density (cm$^{-3}$) | Mobility (cm$^2$/Vs) | Resistivity (Ω cm) | Film thickness (Å) | Time (seconds) | Deposition rate (Å/sec) |
|---|---|---|---|---|---|---|---|---|---|---|
| Comparative Example 2-6 | RF | 1000 | 5.48 | 0.32 | $6.42 \times 10^{18}$ | 12.10 | $8.08 \times 10^{-2}$ | 1039 | 361 | 2.88 |
| Comparative Example 2-7 | RF | 1000 | 5.48 | 0.20 | $1.69 \times 10^{19}$ | 12.10 | $8.08 \times 10^{-2}$ | 976 | 338 | 2.89 |
| Comparative Example 2-8 | RF | 1000 | 5.48 | 0.08 | $2.78 \times 10^{19}$ | 11.10 | $1.97 \times 10^{-2}$ | 1023 | 357 | 2.87 |
| Comparative Example 2-9 | RF | 1000 | 5.48 | 0.00 | $3.17 \times 10^{19}$ | 7.08 | $2.79 \times 10^{-2}$ | 969 | 328 | 2.95 |
| Comparative Example 2-10 | RF | 500 | 2.74 | 0.50 | $1.30 \times 10^{14}$ | 2.88 | $1.67 \times 10^{4}$ | 1013 | 730 | 1.39 |
| Comparative Example 2-11 | RF | 500 | 2.74 | 0.40 | $2.41 \times 10^{15}$ | 11.70 | $2.21 \times 10^{2}$ | 1005 | 713 | 1.41 |
| Comparative Example 2-12 | RF | 500 | 2.74 | 0.32 | $2.13 \times 10^{17}$ | 9.09 | $3.22 \times 10^{0}$ | 1071 | 722 | 1.48 |
| Comparative Example 2-13 | RF | 500 | 2.74 | 0.20 | $3.64 \times 10^{18}$ | 11.80 | $1.45 \times 10^{-1}$ | 1000 | 676 | 1.48 |
| Comparative Example 2-14 | RF | 500 | 2.74 | 0.08 | $2.26 \times 10^{19}$ | 11.70 | $2.36 \times 10^{-2}$ | 1068 | 714 | 1.50 |
| Comparative Example 2-15 | RF | 500 | 2.74 | 0.00 | $2.40 \times 10^{19}$ | 11.70 | $2.23 \times 10^{-2}$ | 989 | 656 | 1.51 |
| Comparative Example 2-16 | RF | 250 | 1.37 | 0.40 | $1.29 \times 10^{14}$ | 15.10 | $3.20 \times 10^{3}$ | 490 | 722 | 0.68 |
| Comparative Example 2-17 | RF | 250 | 1.37 | 0.32 | $8.44 \times 10^{15}$ | 10.40 | $7.14 \times 10^{1}$ | 480 | 676 | 0.71 |
| Comparative Example 2-18 | RF | 250 | 1.37 | 0.08 | $9.25 \times 10^{18}$ | 12.70 | $5.30 \times 10^{-2}$ | 522 | 714 | 0.73 |
| Comparative Example 2-19 | RF | 250 | 1.37 | 0.00 | $6.95 \times 10^{18}$ | 13.80 | $6.51 \times 10^{-2}$ | 477 | 656 | 0.73 |

Examples 2-2 to 2-10

The oxide thin films of Examples 2-2 to 2-10 were produced using the sintered material prepared by the method described in Example 1-1 as a sputtering target under the same conditions as in Example 2-1 except for the modifications of the conditions shown in Table 1. All the films had a composition of InGaZnO$_4$ and were amorphous. The results of the measurement of the electrical characteristics of the films are also shown in Table 1.

Comparative Examples 2-1 to 2-3

The oxide thin films of Comparative Examples 2-1 to 2-3 were produced using the sintered material prepared by the method described in Example 1-1 as a sputtering target under the same conditions as in Example 2-1 except for the modifications of the conditions shown in Table 1. All the films had a composition of InGaZnO$_4$ and were amorphous. The results of the measurement of the electrical characteristics of the films are also shown in Table 1.

Comparative Examples 2-4 to 2-19

The oxide thin films of Comparative Examples 2-4 to 2-19 were produced using the sintered material prepared by the method described in Example 1-1 as a sputtering target under the same conditions as in Example 2-1, except that the power source type was changed to a radio-frequency (RF) type and that some conditions were modified as shown in Table 1. All the films had a composition of InGaZnO$_4$ and were amorphous. The results of the measurement of the electrical characteristics of the films are also shown in Table 1.

Summary of the Results of Examples 2-1 to 2-10 and Comparative Examples 2-1 to 2-19

FIG. 1 is a graph showing the results of the examples, in which the horizontal axis represents the oxygen concentration, and the vertical axis represents the carrier density of the film. The higher the oxygen concentration, the lower the carrier density of the film. This tendency is reasonable, because it is considered that the carrier density of the film is controlled by the oxygen deficiency in the film. At the same oxygen concentration, the carrier density of the film tends to increase with increasing sputtering power. In more detail, however, the case of direct current sputtering shows that when the oxygen concentration is relatively low, a difference in sputtering power makes a small difference in the carrier density of the film, but when the oxygen concentration is relatively high, a difference in sputtering power makes a significant difference in the carrier density of the film. In this case, therefore, a film with a predetermined carrier density can be obtained by controlling the sputtering power during the sputtering as well as by controlling the oxygen concentration.

Based on the finding of this tendency, it has also been found that the oxygen concentration-dependency of the carrier density of the film decreases with increasing sputtering power. This means that the process of forming a film with a specific carrier density can become less susceptible to the change in the oxygen concentration so that the controllability of the carrier density can be improved. In the case of radio-frequency (RF) sputtering, the controllability of the carrier density is not so improved, and a slight change in the oxygen concentration may cause a significant change in the carrier density. When the direct current sputtering is performed at high sputtering power, the controllability of the carrier density of the film can be most improved.

Example 3-1

An oxide thin film was produced using the sintered material described in Example 1-1 as a sputtering target under the same deposition conditions as in Example 2-1, except that the oxygen concentration was changed to 1.5%.

The glass substrate carrying the film obtained by the sputtering was placed in an annealing furnace. First, the furnace was evacuated from the atmospheric pressure to $1\times10^{-2}$ Pa by means of a rotary pump or the like. Pure oxygen gas was then introduced into the furnace, and the oxide thin film was annealed by a process including heating the film to the predetermined temperature of 300° C. in about 1 minute, then maintaining the temperature for 10 minutes, and then allowing the film to cool in the furnace. As a result of Hall measurement, the carrier density of the film was $8.0\times10^{18}$ cm$^{-3}$ before the annealing and $9.8\times10^{16}$ cm$^{-3}$ after the annealing.

Examples 3-2 to 3-9

Besides the oxide thin film of Example 3-1, oxide thin films with two different carrier densities were prepared using the deposition conditions of Example 3-1, except that the oxygen concentration was changed to 0.8% and 0%, so that three types of oxide thin films were prepared in total. These oxide thin films were annealed under different conditions as shown in Table 2. The carrier densities of the annealed films are as shown in Table 2.

Summary of the Results of Examples 3-1 to 3-9

The results show that even though the carrier densities of the films vary to a certain extent before annealing, the carrier densities of the films are reduced and made less variable by annealing in an atmosphere of oxygen or a mixture of 50% by volume of oxygen and 50% by volume of nitrogen. Particularly when the atmosphere gas is oxygen, the carrier densities become close to one another. In contrast, annealing in a nitrogen atmosphere increases the oxygen deficiency, so that the carrier density becomes higher than that before the annealing.

TABLE 2

| | Annealing atmosphere | Annealing temperature (° C.) | Annealing time (minutes) | Carrier density (cm$^{-3}$) before annealing | Carrier density (cm$^{-3}$) after annealing |
|---|---|---|---|---|---|
| Example 3-1 | Oxygen | 300 | 10 | $8.1\times10^{18}$ | $9.9\times10^{16}$ |
| Example 3-2 | Oxygen | 300 | 10 | $2.0\times10^{19}$ | $1.0\times10^{17}$ |
| Example 3-3 | Oxygen | 300 | 10 | $6.0\times10^{19}$ | $1.1\times10^{17}$ |
| Example 3-4 | Oxygen 50%, Nitrogen 50% | 300 | 10 | $8.1\times10^{18}$ | $7.6\times10^{17}$ |
| Example 3-5 | Oxygen 50%, Nitrogen 50% | 300 | 10 | $2.0\times10^{19}$ | $8.0\times10^{17}$ |
| Example 3-6 | Oxygen 50%, Nitrogen 50% | 300 | 10 | $6.0\times10^{19}$ | $8.3\times10^{17}$ |
| Example 3-7 | Nitrogen | 300 | 10 | $8.1\times10^{18}$ | $2.3\times10^{19}$ |
| Example 3-8 | Nitrogen | 300 | 10 | $2.0\times10^{19}$ | $2.6\times10^{19}$ |
| Example 3-9 | Nitrogen | 300 | 10 | $6.0\times10^{19}$ | $6.1\times10^{19}$ |

What is claimed is:

1. A method for producing an amorphous In—Ga—Zn—O based oxide thin film, comprising:
providing a sintered oxide material consisting essentially of indium (In), gallium (Ga), zinc (Zn), and oxygen (O) as constituent elements, wherein a ratio [In]/([In]+[Ga]) of the number of indium atoms to a total number of indium and gallium atoms is from 20% to 80%, a ratio [Zn]/([In]+[Ga]+[Zn]) of the number of zinc atoms to a total number of indium, gallium and zinc atoms is from 10% to 50%, and the sintered oxide material has a specific resistance of $5.0\times10^{-3}$ Ωcm or less; and
producing a film on a substrate by direct current sputtering at a substrate temperature of 25 to 50° C. and a sputtering power density of 2.7 to 6.6 W/cm$^2$ using the sintered oxide material as a sputtering target.

2. The method according to claim 1, wherein the sintered oxide material has a relative density of 95% or more.

3. The method according to claim 1, wherein the sputtering is performed at a deposition rate of 2.5 Å/minute to 5.5 Å/minute.

4. The method according claim 1, further comprising annealing the resulting film at a temperature of 200 to 400 C.° in an atmosphere containing oxygen at a specific concentration to reduce carrier density, after the film is produced on the substrate by the direct current sputtering.

5. The method according to claim 4, wherein the concentration of oxygen in the atmosphere is 100% by volume during the annealing.

6. A method for manufacturing a thin film transistor, comprising the step of forming an active layer using the method according to claim 1.

7. A method for manufacturing an active matrix driving display panel, comprising the step of forming an active device using the method according to claim 6.

8. A sintered oxide material for use as a sputtering target in the method according to any one of claims 1 to 6, consisting essentially of indium (In), gallium (Ga), zinc (Zn), and oxygen (O) as constituent elements, wherein a ratio [In]/([In]+[Ga]) of the number of indium atoms to a total number of indium and gallium atoms is from 20% to 80%, and a ratio [Zn]/([In]+[Ga]+[Zn]) of the number of zinc atoms to a total number of indium, gallium and zinc atoms is from 10% to 50%, the sintered oxide material having a specific resistance of $5.0\times10^{-3}$ Ωcm or less.

9. The sintered oxide material according to claim 8, which has a relative density of 95% or more.

10. The method according to claim 1, wherein the concentration of oxygen in a sputtering gas is from 1 to 3% during the direct current sputtering.

* * * * *